United States Patent [19]

Devanney

[11] Patent Number: 5,541,883
[45] Date of Patent: Jul. 30, 1996

[54] METHOD AND APPARATUS FOR SIMULTANEOUS LONG WRITES OF MULTIPLE CELLS OF A ROW IN A STATIC RAM

[75] Inventor: William L. Devanney, Pacific Grove, Calif.

[73] Assignee: Integrated Device Technology, Inc., Santa Clara, Calif.

[21] Appl. No.: 437,534

[22] Filed: May 9, 1995

Related U.S. Application Data

[62] Division of Ser. No. 190,806, Feb. 1, 1994, Pat. No. 5,440,524.

[51] Int. Cl.⁶ ...................................... G11C 7/00
[52] U.S. Cl. ................. 365/201; 365/203; 365/156
[58] Field of Search ...................... 365/201, 203, 365/189.11, 230.06, 154, 156

[56] References Cited

U.S. PATENT DOCUMENTS

| | | | |
|---|---|---|---|
| 4,665,507 | 5/1987 | Gondou et al. | 365/190 |
| 5,267,212 | 11/1993 | Takashima | 365/201 |
| 5,309,401 | 5/1994 | Suzuki et al. | 365/203 |
| 5,424,988 | 6/1995 | McClure | 365/201 |
| 5,424,990 | 6/1995 | Ohsawa | 365/201 |

Primary Examiner—A. Zarabian
Attorney, Agent, or Firm—Skjerven, Morrill, MacPherson, Franklin and Friel

[57] ABSTRACT

A multiple column select circuit enables simultaneous selection of multiple columns of a static RAM to allow a "long write" test for leakage defects whereas a fewer number of columns are selected during normal operation of the static RAM. In one embodiment, a multiple column select circuit includes an inverter, the output lead of which is coupled to the pull-up circuits of each respective column of the static RAM. When a multiple column select input signal is asserted, a supply voltage supplied to each of the pull-up circuits by the output lead of the inverter switches from $V_{DD}$ to ground potential thereby simultaneously selecting multiple columns of the static RAM. In another embodiment, a multiple column select circuit drives each individual column select line of the memory. When a multiple column select input signal is asserted, each individual column select line is asserted, thereby selecting all columns. When the multiple column select input signal is not asserted, a column addressing circuit controls the voltages on the column select lines through the multiple column select circuit to select only one column.

8 Claims, 4 Drawing Sheets

5,541,883

METHOD AND APPARATUS FOR SIMULTANEOUS LONG WRITES OF MULTIPLE CELLS OF A ROW IN A STATIC RAM

This application is a division of application Ser. No. 08/190,806, filed Feb. 1, 1994, now U.S. Pat. No. 5,440,524.

FIELD OF THE INVENTION

This invention relates to semiconductor memory devices. More particularly, this invention relates to a static random access memory (SRAM) with simultaneous multiple column select circuitry and an associated method.

BACKGROUND INFORMATION

Random access memories (RAMs) are now widely used in computers and other electronic devices. Today, the digital circuit designer has at his or her disposal a wide variety of RAMs of different types and sizes. Generally, the factors used to select a particular RAM for a particular application include price, power consumption, access speed, integrated circuit (IC) chip size and reliability.

For applications requiring a fairly large amount of memory at a minimal cost, dynamic complementary metal oxide semiconductor (CMOS) memory is typically a good compromise. Dynamic memory cells occupy minimal bit cell area, thereby minimizing IC cost, but require circuitry for continuously providing "refresh" cycles necessary to maintain the integrity of the memory content.

On the other hand, if access speed and data integrity are of primary concern, CMOS static RAM (SRAM) memory is a better choice. A static bit cell typically occupies a larger area than a dynamic bit cell on an IC, resulting in higher cost, but is generally easier to use because a static bit cell can maintain its memory content without being refreshed. Other advantages of SRAM memory include faster data access times and reduced power consumption in low frequency applications.

FIG. 1a shows the $r^{th}$ bit cell of the $c^{th}$ column of a prior art static memory IC having a total of C columns and R rows. FIG. 1b shows an example of a conventional row address decoder for an embodiment of the memory shown in FIG. 1a having sixteen rows of memory. Conventionally, "columns" and "rows" refer to the physical layout of the memory cell array. However, the memory is accessed logically as 8-bit, 16-bit or 32-bit words. For example, a 2K×8 memory has 16,384 memory cells typically arranged in an array of 128 columns and 128 rows, and is typically accessed eight bits at a time, so that a user has 2,048 words, each word being eight bits wide.

Referring again to FIG. 1a, the $r^{th}$ memory bit cell 100 of the $C^{th}$ column is shown in greater detail and has a bit output node 120 and a complementary bit output node 130. N-channel field effect transistors (FETs) Q3 and Q4 are coupled to their respective load resistors R1 and R2 which act as internal cell pull-up loads. The gate of FET Q3 is coupled to the drain of the opposing FET Q4 and vice versa. Together, the cross-coupled transistors Q3 and Q4 and load resistors R1 and R2 are responsible for maintaining the logic state of bit cell 100 and thereby retaining bit cell data against any leakage current.

In this configuration, one of FETs Q3 and Q4 is normally ON while the opposing FET is OFF. Bit cell 100 has two stable states, HIGH and LOW. Either state, can be overridden by applying an appropriate sequence of external signals in a write cycle, described in greater detail below. These two stable states provide bit cell 100 with the desired characteristic of a static memory cell.

In the above described static RAM configuration, data is written into and read from each memory cell via a differential pair of bit lines BIT and $\overline{BIT}$. In the storage mode, the voltages on a row select lead and node 110 and a column select lead and node 210 are normally LOW, thereby keeping bit transmission gates Q1, Q2 and column transmission gates 201, 202 OFF.

Pull-up N-channel FETs 301 and 302 of column pull-up circuit 300 are always ON, thereby keeping bit lines BIT and $\overline{BIT}$ normally HIGH when the bit lines are not coupled to a bit cell in column c. Pull-up FETs 301 and 302 are needed due to the low static pull-up current supplied by load resistors R1 and R2. The static pull-up currents supplied by load resistors R1 and R2 are in the range of 5 pA to 500 nA in a typical SRAM cell. If pull-up FETs 301 and 302 were not provided, a leakage current flowing through bit cell 100 due to a charge associated with the stray capacitance of one of bit lines BIT and $\overline{BIT}$ near ground potential may unintentionally flip the state of bit cell 100.

Prior to a read operation, due to the low pull-up current in static bit cell 100, column pull-up FETs 301 and 302 of column pull-up circuit 300 are needed to pull the voltages of both bit lines BIT and $\overline{BIT}$ towards $V_{DD}$ to prevent an excessive differential voltage from developing between bit lines BIT and $\overline{BIT}$. Pull-up circuit 300 can be implemented using other schemes including but not limited to resistors, N-channel transistors, or P-channel transistors, while serving the function of providing a limited conductance connection between bit lines BIT, $\overline{BIT}$ and the $V_{DD}$ supply.

Hence, pull-up circuit 300 comprising FETs 301 and 302 functions in a manner similar to pull-up load resistors (i.e. FETS 301 and 302 are always on). In other words, when bit output node 120 and complementary bit output node 130 are coupled to bit lines BIT and $\overline{BIT}$, respectively, one of the bit lines BIT or $\overline{BIT}$ will contend with one of FETS 301 and 302. During a read cycle, because FETS 301 and 302 form high impedance connections to $V_{DD}$, one of bit output nodes 120 or 130 of bit cell 100 will pull (force) the source of either FET 301 or 302 to a low level. Similarly, when bit cell 100 is being written, the high writing current produced by one of data lines DATA and $\overline{DATA}$ will pull the source of either FET 301 or 302 to a low voltage level.

A read cycle of bit cell 100 is as follows. As described above, when there are no read or write operations in progress, bit lines BIT and $\overline{BIT}$ are normally HIGH due to pull-up circuit 300. If bit cell 100 is in the HIGH state (i.e., bit output node 120 is HIGH and complementary bit output node 130 is LOW) pulling row select lead and node 110 HIGH turns both bit transmission gates Q1 and Q2 ON, thereby coupling bit output node 120 and complementary bit output node 130 to bit lines BIT and $\overline{BIT}$, respectively. In addition, increasing the voltage on column select lead and node 210 serves to turn both column transmission gates 201 and 202 ON, thereby coupling bit lines BIT and $\overline{BIT}$ to data bus lines DATA and $\overline{DATA}$, respectively. As a result, the HIGH voltage level on bit output node 120, together with the complementary LOW level on complementary bit output node 130, are now transmitted onto data bus lines DATA and $\overline{DATA}$, respectively.

A write HIGH cycle of bit cell 100 begins with asserting the desired logic level and its complement onto data bus lines DATA and $\overline{DATA}$, respectively. Placing a logic level HIGH onto column select lead and node 210 turns both column transmission gates 201 and 202 ON. If DATA is HIGH and $\overline{\text{DATA}}$ is LOW, this has the effect of pulling bit line $\overline{\text{BIT}}$ LOW while leaving bit line BIT HIGH. Similarly, driving row select lead and node 110 HIGH turns both bit transmission gates Q1 and Q2 ON. When bit transmission gate Q1 turns ON, bit output node 120 of bit cell 100 (which is coupled to the gate of FET Q4) is pulled HIGH, thereby turning FET Q4 ON. Similarly, when bit transmission gate Q2 turns ON, complementary bit output node 130 of bit cell 100 (which is coupled to the gate of FET Q3) is pulled LOW, thereby turning FET Q3 OFF. Thus bit output node 120 is now set to a HIGH level and complementary bit output node 130 is set to a LOW level at the end of this write cycle when the voltage on the row select line 110 is returned to its normal LOW logic level.

A write LOW cycle of bit cell 100 is very similar because the static RAM memory cell circuitry is substantially symmetrical. Bit output node 120 is set to a LOW logic level and complementary bit output node 130 is a HIGH logic level at the end of the write LOW cycle. This is done by placing LOW and HIGH logic level signals on DATA and $\overline{\text{DATA}}$, respectively, at the start of the write LOW cycle. During write operations, due to higher current supplied via data bus lines DATA and $\overline{\text{DATA}}$, bit line voltages typically go lower in voltage than they do in read operations or when the columns are not being addressed (i.e., in a "deselected" state).

If a manufacturing defect exists such that there is a leakage in bit transmission gates Q1 or Q2 from an internal node of bit cell 100 to bit lines BIT or $\overline{\text{BIT}}$, then an extended write operation (write of a long duration) on the $c^{th}$ column to any one of the other rows (rows 1 to (r−1) and (r+1) to R) can cause the data of bit cell 100 to be corrupted or lost. This is because an extended write to any bit cell other than cell 100 of the $c^{th}$ column provides a current leakage path for an adequate length of time into cell 100 via bit lines BIT and $\overline{\text{BIT}}$ to affect the contents of cell 100. Note that this particular leakage problem does not occur when cell 100 is being read and when cell 100 is in the deselected state, because bit cell 100 is designed to be stable under these conditions.

Further, if one of transistors Q1 and Q2 is not just leaky but rather is completely shorted, then a write and subsequent read operation is sufficient to identify the complete short defect by detecting the inability of cell 100 to latch a logic state and then maintain that logic state during the read operation. Hence no special write is required to test for the complete short defect.

Referring again to FIG. 1a, to test for the above described leakage defect, a write operation is performed separately for each bit line for an adequately long duration, generally on the order of seconds, to guarantee that no such leakage defect exists. This is because leakage currents across FETs Q1 and Q2 can only be detected by "long write" operations in which bit lines BIT and $\overline{\text{BIT}}$ are written to for an extended period (i.e., long enough to allow a defective bit cell in the column to be discharged via leakage).

For example, if bit cell 100 has a capacitance C, and each of pull-up load resistors R1 and R2 has a resistance R, then the approximate duration of such a test is RC, assuming that, in the worst case, the defect indicates a leakage of the same magnitude as the pull-up load resistor current. In the case of a 256K SRAM organized as 256 rows×1024 columns, where columns of bit cells are accessed in groups of eight (i.e. eight columns for each word), 128 separate long write sequences are required to complete the test for the leakage defect failure mode. Each group of columns requires four test combinations (Store 0s, Long Write 1s; Store 1s, Long Write 0s; Store 0s, Long Write 0s; Store 1s, Long Write 1s) for a typical total test time of:

$$t = 4YRC = 1.5 \text{ seconds}$$

wherein:

$R = 10^{11} \, \Omega$ $C = 30$ fF (fF or femto $F = 10^{-15}$ F) (worst case)

$Y = 1024$ columns/8 bits = 128 operations

Accordingly, a bottleneck to an efficient and fast throughput test for this leakage problem is an inability of a conventional SRAM to read or write more columns at a time. The total time required to verify that a typical SRAM is free from this type of defect is therefore significant. This problem will become more severe with increases in memory size in the future. A need therefore exists for a SRAM having addressing logic capable of performing "long write" operations simultaneously to more columns of memory bit cells than would be written to in a "write" operation during normal operation.

SUMMARY

A multiple column select circuit enables simultaneous selection of multiple columns of a static RAM to allow a rapid test for leakage defects whereas a fewer number of columns are selected during normal operation of the static RAM.

In accordance with one embodiment of the present invention, the multiple column select circuit comprises an inverter, the output lead of which is coupled to the pull-up circuits of each respective column of a static RAM. When a multiple column select input signal is asserted, a supply voltage supplied to each of the pull-up circuits by the output lead of the inverter switches from $V_{DD}$ to ground potential, thereby enabling the simultaneous selection of multiple columns of the static RAM.

In accordance with another embodiment of the present invention, the multiple column select circuit drives each individual column select line of the memory. When a multiple column select input signal is asserted, each individual column select line is asserted, thereby enabling selection of all the columns. When the multiple column select input signal is not asserted, a column addressing circuit controls the voltages on the column select lines through the multiple column select circuit.

Hence, with the addition of multiple column select circuitry to a SRAM, a time efficient defect test is performed by simultaneously selecting multiple columns of memory cells. A fewer number of columns of memory cells are later selected during accessing of the memory in normal operation.

DETAILED DESCRIPTION OF PREFERRED EMBODIMENTS

Figure 1A:
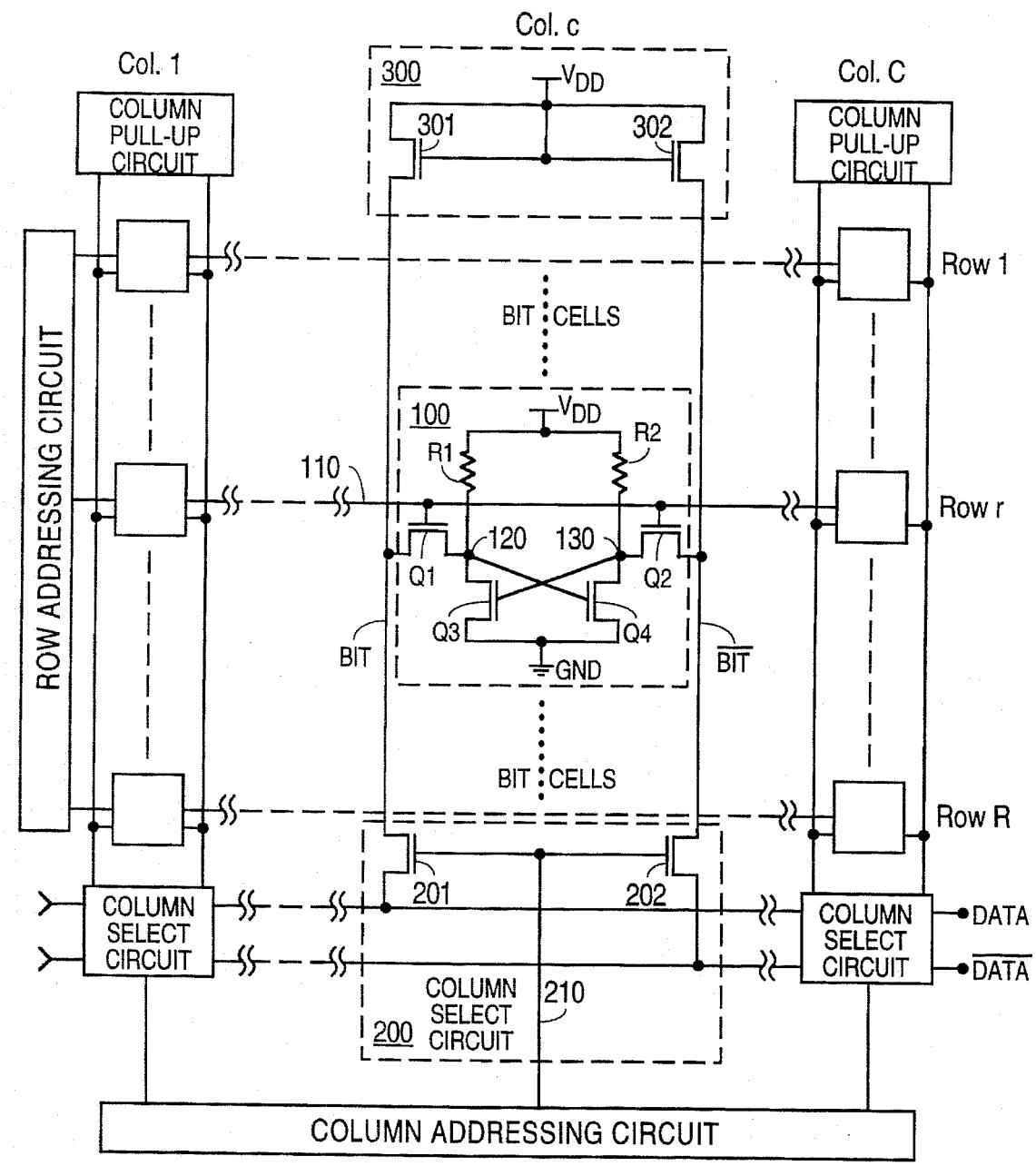
FIG. 1a (Prior Art) is a circuit diagram of an array (C columns×R rows) of static memory cells, showing the $r^{th}$ bit cell of the $c^{th}$ column in greater detail.
Figure 1B:
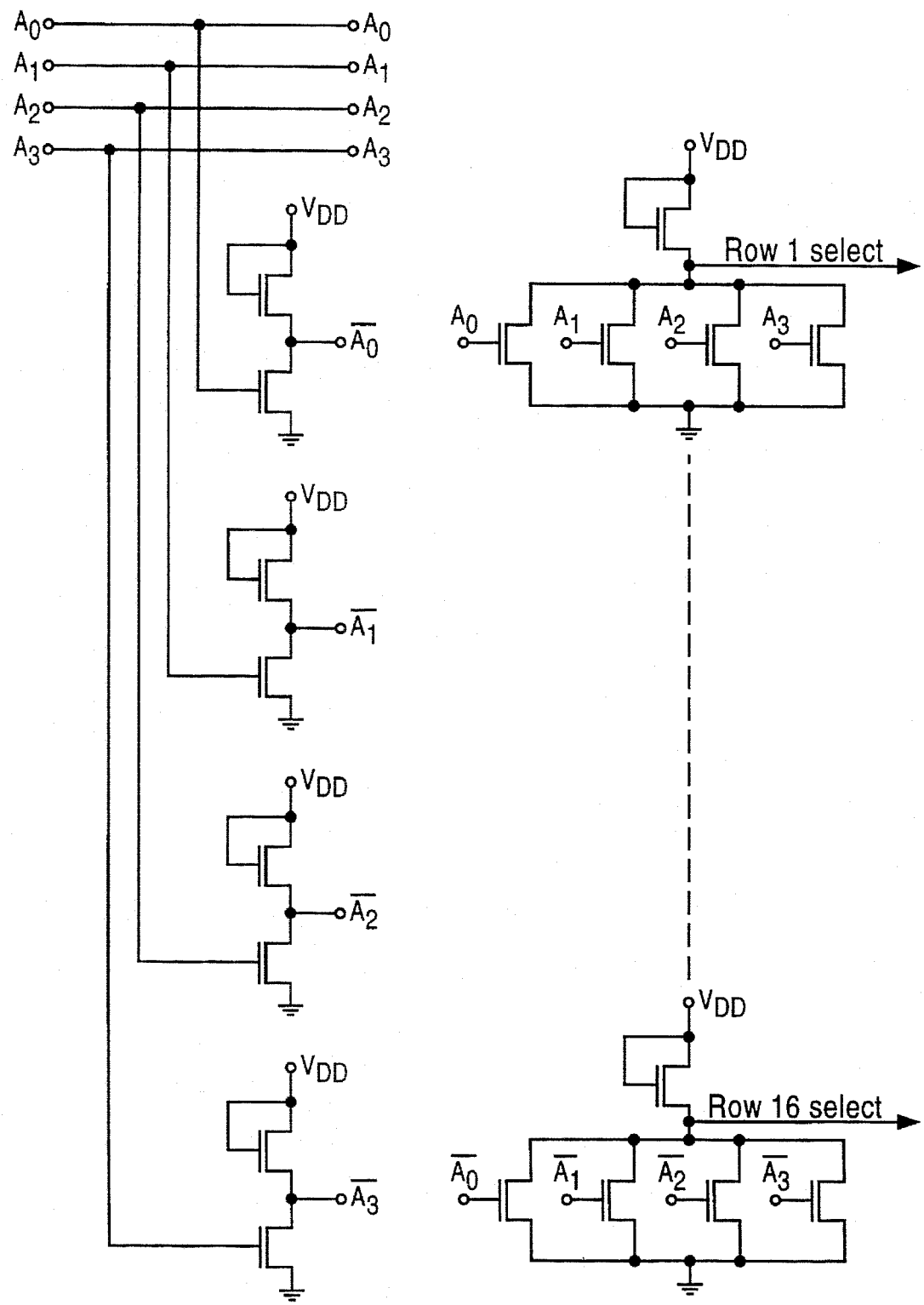
FIG. 1b (Prior Art) is a circuit diagram of a row address decoder circuit for a 16-row memory.
Figure 2:
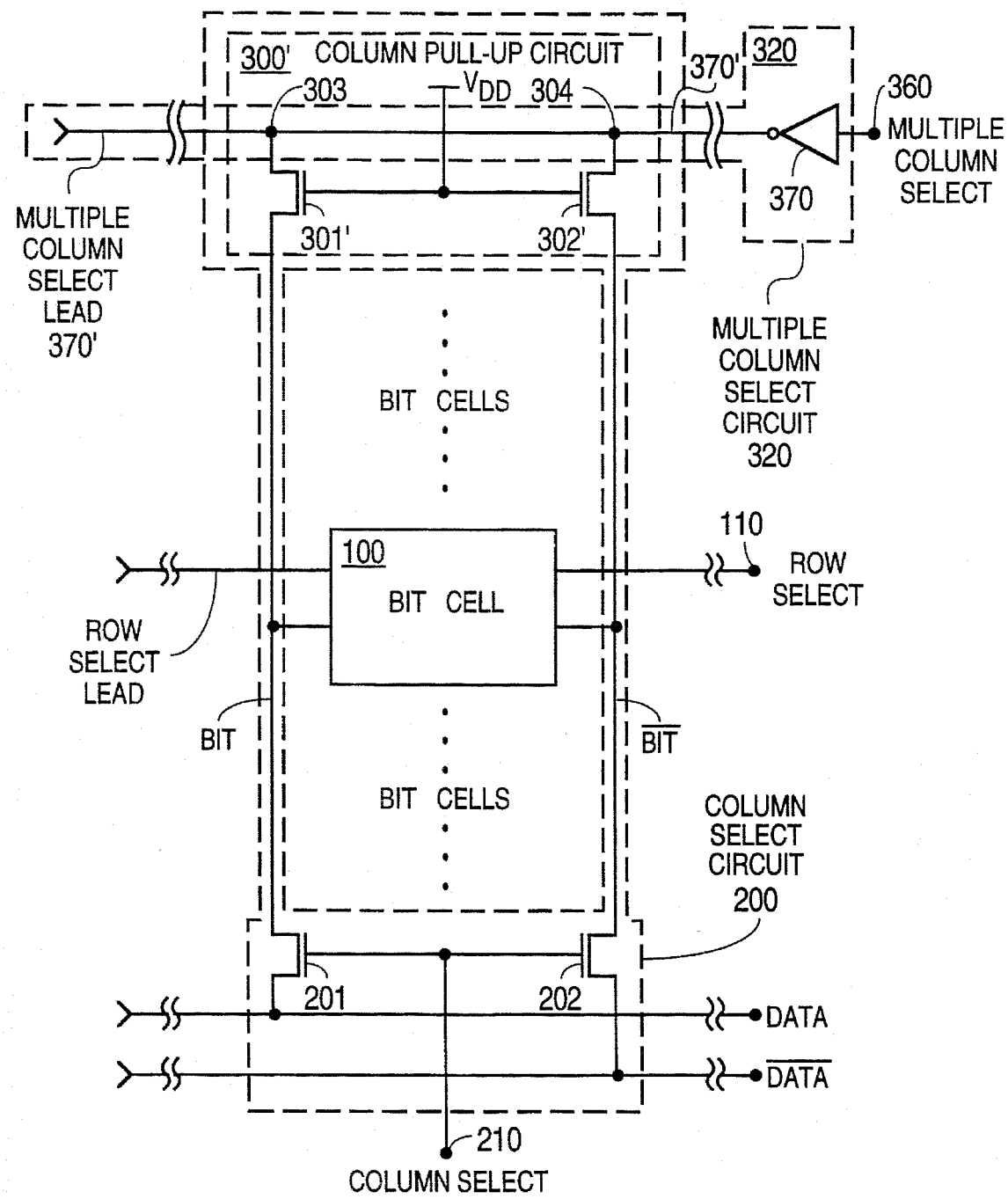
FIG. 2 is a diagram of one column of a static random access memory having the pull-up circuitry of every column coupled to a multiple column select circuit.

FIG. 2 shows a static random access memory bit cell 100 of a column of a matrix of memory cells, a row select lead and node 110 extending horizontally from a row addressing circuit (not shown, see FIG. 1a), a column select lead and node 210 extending vertically from a column select addressing circuit (not shown, see FIG. 1a), a column select circuit 200 comprising a column pull-up circuit 300' two bit lines BIT and $\overline{BIT}$, and two transistors 201 and 202; and a multiple column select circuit 320. The multiple column select circuit 320 is coupled to the column pull-up circuit 300' of each of the columns of the memory matrix via a multiple column select lead 370'. In FIG. 2, multiple column lead 370' is shown extending to the left from the output terminal of inverter 370. A multiple column select node 360 is coupled to the input terminal of inverter 370 of the multiple column select circuit 320. Nodes 303 and 304 of N-channel pull-up FETs 301' and 302' of pull-up circuit 300' are therefore not directly connected to the $V_{DD}$ high voltage supply as in FIG. 1a. Under normal read and write operations, nodes 303 and 304 are kept HIGH by asserting a LOW logic level signal onto multiple column select node 360. In some embodiments, bit cell 100 of FIG. 2 has the same structure as bit cell 100 of FIG. 1a. The reads and writes of the $c^{th}$ column of bit cells are accomplished by asserting appropriate control signals on column select lead and node 210 and row select lead and node 110 as described in detail below.

A write HIGH cycle of bit cell 100 begins with asserting the desired logic level and its complement on data bus lines DATA and $\overline{DATA}$, respectively. If DATA is HIGH and $\overline{DATA}$ is LOW, increasing the voltage on column select node 210 to a HIGH logic level turns both N-channel column transmission gates 201 and 202 ON. This pulls the voltage on bit line $\overline{BIT}$ LOW while leaving the voltage on bit line BIT HIGH. Similarly, increasing the voltage on row select node 110 to a HIGH logic level turns both bit transmission gates ON, thereby setting output node 120 (see bit cell 100 of FIG. 1a) of bit cell 100 to a HIGH level and complementary bit output node 130 to a LOW level at the end of this write cycle when row select lead and node 110 is returned to its normal LOW state. A write LOW cycle of bit cell 100 is very similar because the static RAM memory cell circuitry is substantially symmetrical.

A read cycle of bit cell 100 occurs as follows. When there are no read or write operations in progress, bit lines BIT and $\overline{BIT}$ are normally HIGH due to column pull-up circuit 300'. When bit cell 100 is in the HIGH state (i.e., bit output node 120 is HIGH and complementary bit output node 130 is LOW), forcing row select lead and node 110 HIGH turns both bit transmission gates Q1 and Q2 (see bit cell 100 of FIG. 1a) ON, thereby coupling bit output node 120 and complementary bit output node 130 to bit lines BIT and $\overline{BIT}$, respectively. In addition, raising the voltage on column select lead and node 210 turns both column transmission gates 201 and 202 ON, thereby coupling bit lines BIT and $\overline{BIT}$ to data bus lines DATA and $\overline{DATA}$, respectively. As a result, the HIGH voltage logic level on bit output node 120, together with the complementary LOW voltage logic level on complementary bit output node 130, are now transmitted onto data bus lines DATA and $\overline{DATA}$, respectively. Bit line $\overline{BIT}$ provides sufficient current to win the logic level contention with high impedance pull-up FET 302'.

Conversely, when bit cell 100 is in the LOW state, increasing the voltage on row select lead and node 110 to a HIGH logic level turns both bit transmission gates Q1 and Q2 ON. Increasing the voltage on column select lead and node 210 to a HIGH logic level turns both column transmission gates 201 and 202 ON. The resulting LOW level on bit output node 120 and the corresponding HIGH on complementary bit output node 130 are transmitted onto data bus lines DATA and $\overline{DATA}$, respectively.

To activate a special "long write" test mode, a LOW logic level is supplied to all the pull-up circuits (e.g. pull-up circuit 300' of the $c^{th}$ column, and of every column in the entire chip) by asserting a HIGH logic level on multiple column select node 360, thereby pulling nodes 303 and 304 to a LOW logic level or to a voltage intended to simulate the voltage applied on the bit lines during normal write operations. This allows all bit lines to be forced to a LOW logic level without requiring individual write operations to be performed on every bit line. Row select lead and node 110 remains LOW (i.e., unasserted) in this test mode.

Using multiple column select circuit 320, it is now possible to ground the bit line pairs of all the columns of the SRAM including bit lines BIT and $\overline{BIT}$ simultaneously, thereby reducing the total test time t to 2RC (for example, 0.06 seconds using the values of R and C mentioned above). In this embodiment, multiple column select circuit 320 could be as simple as an inverter 370. A test mode signal is supplied to the input terminal of inverter 370. This test mode signal goes HIGH during "long write" testing, but remains LOW during normal circuit operations, thereby providing a HIGH logic level voltage (simulating a $V_{DD}$ high power supply) to all the bitline pull-up circuits at nodes corresponding to nodes 303 and 304 under normal operating conditions. Other multiple column select circuits are also possible, the basic concept being to isolate multiple bit line pairs (such as nodes 303 and 304 of bit lines BIT and $\overline{BIT}$) from the $V_{DD}$ supply so that parallel testing of multiple bit line pairs is possible.

Figure 3:
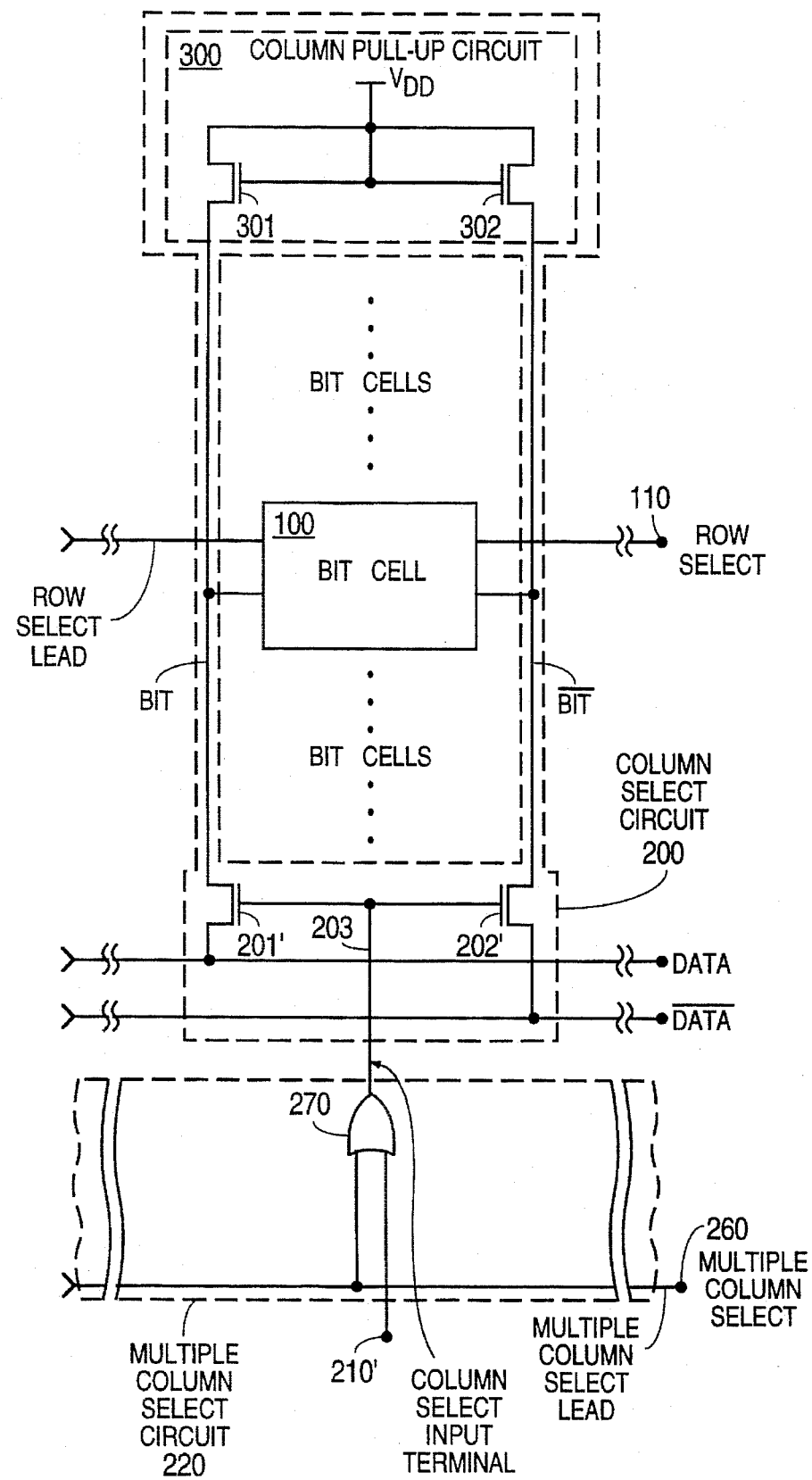
FIG. 3 is a diagram of one column of a random access memory, the column select input terminals of the column being coupled to the output lead of a 2-input OR gate of a multiple column select circuit, one input of the OR gate being coupled to a multiple column select lead.

FIG. 3 shows a column of a SRAM cells in accordance with another embodiment of the present invention. An input terminal of a column select circuit 200 of the column of SRAM cells is coupled to a corresponding output terminal of a multiple column select circuit 220. The multiple column select circuit 220 comprises a plurality of two-input OR gates. One input lead of each of the OR gates is coupled to a multiple column select node 260 while the other input lead of each OR gate is coupled to a corresponding column select line (i.e., individual column select node 210'). The output lead of each of the OR gates of the multiple column select circuit 220 is a corresponding one of the output terminals of the multiple column select circuit 220. OR gate 270 in FIG. 3 is one of the OR gates of multiple column select circuit 220. Bit cell 100 is the same as the bit cell structure of FIG. 1a. In a normal read or write operation, column select node 210' is used to select or deselect the column illustrated. This is accomplished by asserting a logic level HIGH onto column select node 210' as well as onto the appropriate row select line (such as row select lead and node 110) as described in greater detail below.

A write HIGH cycle of bit cell 100 begins with asserting the desired logic level and its complement on data bus lines DATA and $\overline{DATA}$, respectively, and then raising the voltage on column select node 210' HIGH to turn both column transmission gates 201' and 202' ON. When bus line DATA is HIGH and bus line $\overline{\text{DATA}}$ is LOW, bit line $\overline{\text{BIT}}$ is pulled LOW while leaving bit line BIT HIGH. Although bitlines $\overline{\text{BIT}}$ and BIT are both normally HIGH when bit cell 100 is not selected, as described above, the higher write current provided by data line DATA and $\overline{\text{DATA}}$ wins the voltage contention. Next, forcing the voltage on row select node 110 HIGH turns both bit transmission gates (see FIG. 1a) of bit cell 100 ON, thereby setting the bit output node (see FIG. 1a) of bit cell 100 to a HIGH level and the complementary bit output node (see FIG. 1a) to a LOW level at the end of this write cycle when row select node 110 is returned to its normal LOW logic level. A write LOW cycle of bit cell 100 is very similar because the static RAM memory cell circuitry is symmetrical.

A read cycle of the bit cell 100 is as follows. As described above, when there are no read or write operations in progress, bit lines BIT and $\overline{\text{BIT}}$ are normally HIGH due to high impedance pull-up circuit 300. When bit cell 100 is in the HIGH state (i.e., the bit output node is HIGH and the complementary bit output node is LOW), forcing the voltage on row select node 110 HIGH turns both bit transmission gates Q1 and Q2 ON (see bit cell 100 of FIG. 1a), thereby coupling the bit output node and the complementary bit output node to bit lines BIT and $\overline{\text{BIT}}$, respectively. In addition, raising the voltage on column select node 210' turns both column transmission gates 201' and 202' ON, thereby coupling bit lines BIT and $\overline{\text{BIT}}$ to data bus lines DATA and $\overline{\text{DATA}}$, respectively. As a result, the HIGH logic level on the bit output node (not shown), together with the complementary LOW level on the complementary bit output node (not shown), are now transmitted onto data bus lines DATA and $\overline{\text{DATA}}$, respectively. Again as discussed above, bit line $\overline{\text{BIT}}$ wins the logic level contention with high impedance pull-up FET 302.

When the "long write" test is needed, a HIGH logic level is asserted onto multiple column select lead and node 260 to select all columns simultaneously. Row select lead and node 110 remains LOW. Raising the voltage on multiple column select node 260 causes the output lead of OR gate 270 to go HIGH, thereby turning column transmission gates 201' and 202' ON. Asserting a HIGH logic level onto multiple column select lead and node 260 therefore results in the simultaneous selection of all the columns of the SRAM.

In accordance with another embodiment, columns of an SRAM are divided into groups of columns. Each group of columns is coupled to a different "group" multiple column select node which makes it possible to perform a "long write" of multiple columns of the SRAM one group at a time, simply by duplicating the multiple column select circuitry of the first or second embodiment for each group of columns. Other embodiments are also possible. For example, semiconductor elements of opposite polarities to those described above may be used to accomplish the same result (i.e., P-channel FETs may be used instead of N-channel FETs and/or pull-down transistors may be used instead of pull-up transistors).

While this invention has been described with reference to particular embodiments, this description is not intended to be limiting, and other embodiments within the scope of the claimed invention are possible. Bit cell architectures other than the specific bit cell architecture illustrated may be employed in connection with the present invention. The present invention is not limited to the specific column select circuit and the specific pull-up circuit illustrated. Digital logic other than an inverter can be used to control the voltage on nodes of pull-up circuits and digital logic other than OR gates can be used to drive the column select input terminals of an SRAM. Thus, while this invention has been described in connection with an inverter or an OR gate selecting multiple columns of SRAM, it is be understood that changes, modifications, adaptations and combinations of various features of the above described specific embodiments can be practiced without departing from the scope of the invention as set forth in the appended claims.

I claim:

1. An integrated circuit, comprising:

a plurality of static random access memory cells organized in a matrix having a plurality of rows and a plurality of columns, each of said cells having a bit output node and a bit transmission gate;

a plurality of bit lines, said bit lines having a one-to-one correspondence with said columns of memory cells, one terminal of the bit transmission gate of each memory cell being coupled to the bit output node of said memory cell, another terminal of the bit transmission gate of said memory cell being coupled to a bit line corresponding with the column within which said memory cell is disposed;

means for testing said plurality of memory cells by driving a first digital logic voltage onto a first number of said bit lines for a first period of time in a first write cycle when the transmission gates coupled to said first number of said bit lines are controlled to be nonconductive and when the memory cells of which said transmission gates are part store a second digital logic voltage on their respective bit output nodes; and means for writing data into memory cells by driving a data voltage onto a second number of said bit lines for a second period of time in a second write cycle, said first number of bit lines being greater than said second number of bit lines, said first period of time being of a significantly longer duration than said second period of time.

2. The integrated circuit of claim 1, wherein said second number is one.

3. The integrated circuit of claim 1, wherein said second number is greater than one.

4. The integrated circuit of claim 2, further comprising a second plurality of bit lines, said second plurality of bit lines also having a one-to-one correspondence with said columns of memory cells.

5. The integrated circuit of claim 1, wherein said means for testing comprises:

a multiple column select lead coupled to a plurality of column pull-up circuits; and a digital logic element driving said first digital logic voltage onto said multiple column select lead.

6. The integrated circuit of claim 1, wherein said means for testing comprises:

a plurality of digital logic elements and a multiple column select input lead, an input terminal of each of said digital logic elements being coupled to said multiple column select input lead.

7. A method, comprising:

(a) driving a test voltage onto a first number of bit lines of a static random access memory integrated circuit for a first period of time in a first write cycle, a plurality of memory cells being coupled to said first number of bit lines, each of said memory cells having a bit output node and a bit transmission gate, one terminal of each said bit column transmission gate being coupled to a corresponding one of said first number of bit lines, another terminal of each said bit column transmission gate being coupled to the bit output node of the memory cell of which the transmission gate is a part, all the bit column transmission gates coupled to said first number of bit lines being controlled to be nonconductive; and (b) driving a data voltage onto a second number of bit lines of said static random access memory integrated circuit for a second period of time in a second write cycle, said first number of bit lines being greater than said second number of bit lines, said first period of time being of a significantly longer duration than said second period of time.

8. The method of claim 7, wherein step (a) is used to test the static random access memory integrated circuit for defects, and wherein step (b) is an ordinary write cycle of the static random access memory integrated circuit.

* * * * *